(12) United States Patent
Long et al.

(10) Patent No.: US 12,347,661 B2
(45) Date of Patent: Jul. 1, 2025

(54) PRESSURE CONTROL SYSTEM FOR A MULTI-HEAD PROCESSING CHAMBER OF A PLASMA PROCESSING APPARATUS

(71) Applicants: Beijing E-Town Semiconductor Technology Co., Ltd., Beijing (CN); Mattson Technology, Inc., Fremont, CA (US)

(72) Inventors: Maolin Long, Santa Clara, CA (US); Changle Guan, Beijing (CN); Junliang Li, Wuhan (CN)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 637 days.

(21) Appl. No.: 17/412,969

(22) Filed: Aug. 26, 2021

(65) Prior Publication Data

US 2023/0012873 A1    Jan. 19, 2023

(30) Foreign Application Priority Data

Jul. 16, 2021   (CN) .......................... 202110805518.2

(51) Int. Cl.
*H01J 37/32*    (2006.01)

(52) U.S. Cl.
CPC .. *H01J 37/32816* (2013.01); *H01J 37/32449* (2013.01)

(58) Field of Classification Search
CPC .... C23C 16/4412; H01J 37/321–32119; H01J 37/32449; H01J 37/32816; H01J 37/32834; H01L 21/67017
See application file for complete search history.

(56) References Cited

U.S. PATENT DOCUMENTS

| 8,617,347 B2 * | 12/2013 | Kim | H01J 37/3244 |
| | | | 156/345.31 |
| 9,797,521 B1 * | 10/2017 | Davis | F16K 3/12 |
| 11,201,036 B2 * | 12/2021 | Ma | H01J 37/32816 |

(Continued)

FOREIGN PATENT DOCUMENTS

| CN | 212775620 | 3/2021 |
| WO | WO 2020069901 A1 | 4/2020 |

OTHER PUBLICATIONS

CN App. No. 2021108055182; Office Action Dated Sep. 30, 2024, 8 pages.

*Primary Examiner* — Benjamin Kendall
(74) *Attorney, Agent, or Firm* — Dority & Manning, P.A.

(57) ABSTRACT

A pressure control system is provided. The pressure control system includes a member at least partially positioned within a pumping port fluidly coupled between a multi-head processing chamber and a pump configured to evacuate gases from the multi-head processing chamber. The member is rotatable relative to the pumping port. The pressure control system includes a plurality of pressure sensors. Each of the pressure sensors is configured to obtain data indicative of a pressure of a flow of gas entering the multi-head processing chamber at a corresponding head of the multi-head processing chamber. The pressure control system includes an actuator configured to rotate the member to control a pressure of a flow of gas at a first processing head of the multi-head processing chamber.

13 Claims, 7 Drawing Sheets

(56) References Cited

U.S. PATENT DOCUMENTS

| | | | |
|---|---|---|---|
| 2003/0176074 A1* | 9/2003 | Paterson | H01J 37/32458 |
| | | | 438/709 |
| 2005/0247265 A1* | 11/2005 | Devine | H01L 21/6719 |
| | | | 427/248.1 |
| 2005/0283321 A1 | 12/2005 | Yue et al. | |
| 2009/0028761 A1* | 1/2009 | Devine | H01L 21/6719 |
| | | | 422/186.04 |
| 2020/0216952 A1 | 7/2020 | Ghosh et al. | |
| 2021/0246551 A1* | 8/2021 | Otto | C23C 16/34 |

* cited by examiner

PRESSURE CONTROL SYSTEM FOR A MULTI-HEAD PROCESSING CHAMBER OF A PLASMA PROCESSING APPARATUS

PRIORITY CLAIM

The present application claims the benefit of priority of Chinese Patent Application No. 202110805518.2, titled "Pressure Control System for a Multi-Head Processing Chamber of a Plasma Processing Apparatus," having a filing date of Jul. 16, 2021, which is incorporated by reference herein.

FIELD

The present disclosure relates generally to plasma processing apparatuses having a multi-head processing chamber and more, specifically, a pressure control system for the multi-head processing chamber.

BACKGROUND

Plasma processing tools can be used in the manufacture of devices such as integrated circuits, micromechanical devices, flat panel displays, and other devices. Plasma processing tools used in modern plasma etch applications can be required to provide a high plasma uniformity and a plurality of plasma controls, including independent plasma profile, plasma density, and ion energy controls. Plasma processing tools can, in some cases, be required to sustain a stable plasma in a variety of process gases and under a variety of different conditions (e.g. gas flow, gas pressure, etc.).

Plasma processing tools can include a processing chamber in which a workpiece (e.g., semiconductor wafer) is processed. For example, the processing chamber can be a dual-head chamber sharing a common gas supply. Plasma processing tools can include a throttle valve fluidly coupled to the common gas supply. The throttle valve can be moveable between a first position (e.g. fully open position) and a second position (e.g., fully closed position) to selectively deliver gas to each head of the dual head chamber. In some instances, a pressure differential between a first head of the dual-head chamber and a second head of the dual-head chamber can occur due, at least in part, to the throttle valve being in an intermediate third position. This pressure differential can, for instance, lead to non-uniformities in the processing of one or more workpieces being processed.

SUMMARY

Aspects and advantages of the disclosure will be set forth in part in the following description, or may be obvious from the description, or may be learned through practice of the embodiments.

In one aspect, a pressure control system is provided. The pressure control system includes a member at least partially positioned within a pumping port fluidly coupled between a multi-head processing chamber and a pump configured to evacuate gases from the multi-head processing chamber. The member is rotatable relative to the pumping port. The pressure control system includes a plurality of pressure sensors. Each of the pressure sensors is configured to obtain data indicative of a pressure of a flow of gas entering the multi-head processing chamber at a corresponding head of the multi-head processing chamber. The pressure control system includes an actuator configured to rotate the member to control a pressure of a flow of gas at a first processing head of the multi-head processing chamber.

In another aspect, a method of controlling operation of a pressure control system for a multi-head processing chamber of a plasma processing apparatus is provided. The method includes obtaining first data from a first pressure sensor of the pressure control system, the first data indicative of a pressure of a flow of gas entering the multi-head processing chamber via a first head of the multi-head processing chamber. The method further includes providing one or more control signals based, at least in part, on the first data, the one or more control signals associated with rotating a member at least partially positioned within a pumping port fluidly coupled between the multi-head processing chamber and a pump configured to evacuate gases from the multi-head processing chamber.

In yet another aspect, a plasma processing apparatus is provided. The plasma processing apparatus includes a multi-head processing chamber. The plasma processing apparatus includes a pumping port fluidly coupled to the multi-head processing chamber. The plasma processing apparatus includes a pump fluidly coupled to the multi-head processing chamber via the pumping port. The pump is configured to evacuate gases from the multi-head processing chamber via the pumping port. The plasma processing apparatus includes a pressure control system. The pressure control system includes a member at least partially positioned within the pumping port. The member is rotatable relative to the pumping port. The pressure control system includes a plurality of pressure sensors. Each of the pressure sensors is configured to obtain data indicative of a pressure of a flow of gas entering the multi-head processing chamber via a corresponding head of the multi-head processing chamber. The pressure control system includes an actuator configured to rotate the member to control a pressure of a flow of gas at a first head of the multi-head processing chamber.

These and other features, aspects and advantages of the present disclosure will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure to one of ordinary skill in the art is set forth more particularly in the remainder of the specification, including reference to the accompanying figures, in which.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to plasma processing apparatuses. Plasma processing apparatuses can include a multi-head processing chamber. For instance, the processing chamber can be divided into multiple processing areas. Each of the processing areas can include a pedestal assembly configured to support a workpiece. Furthermore, gas can be provided to each of the workspaces via separate gas feeds. For instance, a first gas feed can provide gas to a first processing area of the multi-head processing chamber at a first head thereof. Conversely, a second gas feed can provide gas to a second processing area of the multi-head processing chamber at a second head thereof.

Plasma processing apparatuses can include a throttle valve movable between at least a first position (e.g., fully open) and a second position (e.g., fully closed) to control gas delivery to each head of the multi-head processing chamber. For instance, gas can flow into each of the processing areas when the throttle valve is in the first position. Conversely, gas cannot flow into the processing areas when the throttle valve is in the second position. In some instances, the throttle valve may not fully open or fully close. When this occurs, a pressure differential is created, because a pressure of a first flow of gas flowing into the first processing area at the first head is different (e.g., greater, less) than a pressure of a second flow of gas flowing into the second area at the second head. This pressure differential can, for instance, lead to non-uniformities in the processing of one or more workpieces being processed in the respective processing chambers.

Example aspects of the present disclosure are directed to a pressure control system for plasma processing apparatuses having a multi-head processing chamber. The pressure control system can include a pumping port that is positioned downstream of the heads of the multi-head processing chamber. For instance, the pumping port can be coupled to a floor of the multi-head processing chamber, whereas each of the heads of the multi-head processing chamber can be located at a ceiling (e.g., top plate) of the multi-head processing chamber The pressure control system can include a member that is at least partially positioned within the pumping port. For instance, in some implementations, the member can include a flap that is rotatable relative to the pumping port. Furthermore, in some implementations, the flap can have a range of motion of about 180 degrees.

The pressure control system can include a plurality of pressure sensors. For instance, the pressure control system can include a first pressure sensor configured to obtain data indicative of a pressure of the first flow of gas entering the first processing area at the first head of the plasma processing apparatus. The pressure control system can further include a second pressure sensor configured to obtain data indicative of a pressure of a second flow of gas entering the second processing area at the second head of the plasma processing apparatus. In some implementations, the first pressure sensor and the second pressure sensor can each include a manometer.

The pressure control system can include an actuator configured to move the member. For instance, in some implementations, the actuator can be configured to rotate the member about an axis of rotation in a first direction (e.g., clockwise) or a second direction (e.g., counterclockwise). The actuator can be configured to rotate the member in the first direction or the second direction based on at least one of first data obtained from the first pressure sensor or second data obtained from the second pressure sensor.

In some implementations, only one of the processing areas of the multi-head processing chamber may be occupied. For instance, a workpiece can be disposed on the pedestal assembly associated with the first processing area of the multi-head processing chamber, whereas every other processing area of the multi-head processing chamber can be vacant (that is, not occupied by a workpiece). Furthermore, since only the first processing area of the multi-head processing chamber is occupied, gas can be injected into the first processing area at only the first head thereof. In such implementations, the actuator can be configured to rotate the member in the first direction or the second direction based, at least in part, on data obtained from the first pressure sensor configured to obtain data indicative of the pressure of the flow of gas entering the processing area at the first head of the multi-head processing chamber.

In some implementations, multiple processing areas of the multi-head processing chamber may be occupied. For instance, a first workpiece can be disposed on the pedestal assembly associated with the first processing area, whereas a second workpiece can be disposed on the pedestal assembly associated with the second processing area. In such implementations, gas can be injected into the first processing area at the first head of the multi-head processing chamber. Additionally, gas can be injected into the second processing area at the second head of the multi-head processing chamber. As will be discussed below, the actuator can rotate the member about the axis of rotation in the first direction or the second direction to control a pressure differential between the pressure of the flow of gas entering the first processing area at the first head of the multi-head processing chamber and the pressure of the flow of gas entering the second processing area at the second head of the multi-head processing chamber.

In some implementations, the actuator can rotate the member about the axis of rotation in the first direction or the second direction to eliminate or reduce the pressure differential. For instance, the actuator can be configured to rotate the member in the first direction or the second direction until the first data obtained from the first pressure sensor and the second data obtained from the second pressure sensor indicate the pressure of the flow of gas entering the first processing area at the first head of the multi-head processing chamber matches the pressure of the flow of gas entering the second processing area at the second head of the multi-head processing chamber. In this manner, the pressure control system can monitor the pressure differential in real-time or near-real time and operate the actuator accordingly to eliminate the pressure differential to prevent or reduce occurrence of non-uniformities in processing of the workpieces (e.g., first workpiece and second workpiece) being processed within the multi-head processing chamber.

In some implementations, the actuator can rotate the member about the axis of rotation in the first direction or the second direction to cause a desired pressure differential between the pressure of the flow of gas entering the first processing area at the first head of the multi-head processing chamber and the pressure of the flow of gas entering the second processing area at the second head of the multi-head processing chamber. For instance, in some implementations, the actuator can be configured to rotate the member in the first direction or the second direction until the first data obtained from the first pressure sensor and the second data obtained from the second pressure sensor indicate that the pressure differential matches a predefined pressure differential that is greater than zero.

Pressure control systems according to example aspects of the present disclosure can have a number of technical effects and benefits. For instance, the pressure sensors located at each of the heads of the multi-head processing chamber can obtain data that can be used to determine occurrence of a pressure differential between two heads of the multi-head processing chamber. Furthermore, the member at least partially positioned within the pumping port that is downstream of the heads of the multi-head processing chamber can be moved (e.g., rotated) as needed to control the pressure differential. In this manner, non-uniformities in the processing of workpieces due, at least in part, to the pressure differential can be reduced, because the pressure differential can be controlled in real-time or near real-time.

Aspects of the present disclosure are discussed with reference to a "substrate" or "wafer" for purposes of illustration and discussion. Those of ordinary skill in the art, using the disclosures provided herein, will understand that the example aspects of the present disclosure can be used in association with any semiconductor substrate or other suitable substrate or workpiece. Furthermore, as used herein, the terms "substantially" and "about" refer to a range of values within 10 percent of a stated numerical value.

Figure 1:
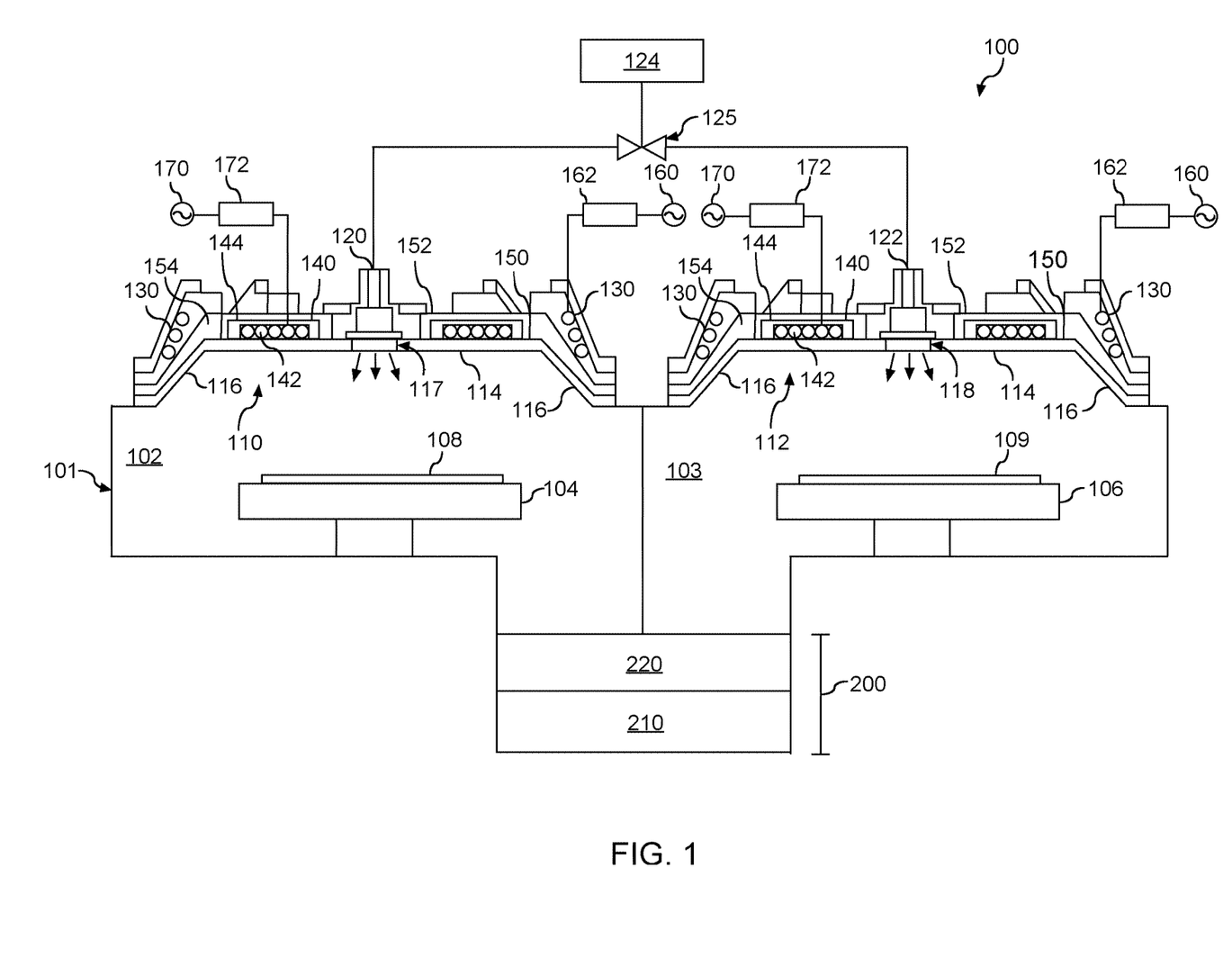
FIG. 1 depicts a plasma processing apparatus according to an example embodiment of the present disclosure.

Referring now to the FIGS., FIG. 1 depicts a plasma processing apparatus 100 according to example embodiments of the present disclosure. The present disclosure is discussed with reference to the plasma processing apparatus 100 depicted in FIG. 1 for purposes of illustration and discussion. Those of ordinary skill in the art, using the disclosures provided herein, will understand that example aspects of the present disclosure can be used with other processing tools and/or apparatus without deviating from the scope of the present disclosure, such as plasma strip tools, thermal processing tools, etc.

The plasma processing apparatus 100 includes a multi-head processing chamber 101. The interior of the multi-head processing chamber 101 can include at least a first processing area 102 and a second processing area 103. In some implementations, the plasma processing apparatus 100 can include a first pedestal assembly 104 and a second pedestal assembly 106. The first pedestal assembly 104 can be configured to support a first workpiece 108 (e.g., semiconductor wafer) for processing within the first processing area 102. The second pedestal assembly 106 can be configured to support a second workpiece 109 (e.g., semiconductor wafer) for processing within the second processing area 103. In alternative implementations, the plasma processing apparatus 100 can include a common pedestal assembly to support both the first workpiece 108 and the second workpiece 109.

The plasma processing apparatus 100 can include a first dielectric window 110 and a second dielectric window 112. The first dielectric window 110 can define a ceiling of the first processing area 102. The second dielectric window 112 can define a ceiling of the second processing area 103. In some implementations, the first dielectric window 110 and the second dielectric window 112 can each include a relatively flat central portion 114 and an angled peripheral portion 116. Alternatively, or additionally, the first dielectric window 110 and the second dielectric window 112 can include a dielectric material, such as a quartz material.

The plasma processing apparatus 100 can include a first showerhead 120 and a second showerhead 122. The first showerhead 120 and the second showerhead 122 can each be in fluid communication with a gas supply 124. The first showerhead 120 can extend into a first opening 117 defined by the central portion 114 of the first dielectric window 110. In this manner, the first showerhead 120 can feed process gas into the first processing area 102. The second showerhead 122 can extend into a second opening 118 defined by the central portion 114 of the second dielectric window 112. In this manner, the second showerhead 122 can feed process gas into the second processing area 103.

The plasma processing apparatus 100 can include a throttle valve 126. The throttle valve 126 can be fluidly coupled between the gas supply 124 and the first showerhead 120. Additionally, the throttle valve 126 can be fluidly coupled between the gas supply 124 and the second showerhead 122. Furthermore, the throttle valve 126 can move between at least a first position (e.g., fully open) and a second position (e.g., fully closed) to control a flow of gas from the gas supply to the first showerhead 120 and the second showerhead 122. For instance, gas can flow from the gas supply 124 to each of the first showerhead 120 and the second showerhead 122 when the throttle valve 126 is in the first position (e.g., fully open). Conversely, gas cannot flow from the gas supply 124 to each of the first showerhead 120 and the second showerhead 122 when the throttle valve 126 is in the second position (e.g., fully closed).

The plasma processing apparatus 100 further includes one or more inductive elements, such as primary inductive elements 130 and an optional secondary inductive elements 140, for generating an inductive plasma in the first processing area 102 and the second processing area 103. The inductive elements 130, 140 can include a coil or antenna element that when supplied with RF power, induces a plasma in the process gas in the first processing area 102 and the second processing area 103. For instance, a first RF generator 160 can be configured to provide electromagnetic energy through a matching network 162 to the primary inductive element 130. A second RF generator 170 can be configured to provide electromagnetic energy through a matching network 172 to the secondary inductive element 140.

While the present disclosure makes reference to a primary inductive element and a secondary inductive element, those of ordinary skill in the art, should appreciate that the terms primary and secondary are used for convenience purposes only. The secondary coil can be operated independently of the primary coil. The primary coil can be operated independently of the secondary coil. In addition, in some embodiments, the plasma processing apparatus may only have a single inductive coupling element.

According to aspects of the present disclosure, the plasma processing apparatus 100 can include a metal shield portion 152 disposed around the secondary inductive element 140. The metal shield portion 152 separates the primary inductive element 130 and the secondary inductive element 140 to reduce cross-talk between the inductive elements 130, 140. The plasma processing apparatus 100 can further include a first Faraday shield 154 disposed between the primary inductive element 130 and the dielectric window (e.g., first dielectric window 110 and second dielectric window 112). The first Faraday shield 154 can be a slotted metal shield that reduces capacitive coupling between the primary inductive element 130 and the multi-head processing chamber 101 (e.g., first processing area 102, second processing area 103). As illustrated, the first Faraday shield 154 can fit over the angled portion of the dielectric window 110, 112.

In some implementations, the metal shield portion 152 and the first Faraday shield 154 can form a unitary body metal shield/Faraday shield 150 for ease of manufacturing and other purposes. The multi-turn coil of the primary inductive element 130 can be located adjacent the first Faraday shield 154 of the unitary body metal shield/Faraday shield 150. The secondary inductive element 140 can be located proximate the metal shield portion 152 of metal shield/Faraday shield unitary body 150, such as between the metal shield portion 152 and the dielectric window 110, 112.

The arrangement of the primary inductive element 130 and the secondary inductive element 140 on opposite sides of the metal shield portion 152 allows the primary inductive element 130 and secondary inductive element 140 to have distinct structural configurations and to perform different functions. For instance, the primary inductive element 130 can include a multi-turn coil located adjacent a peripheral portion of the multi-head processing chamber 101. The primary inductive element 130 can be used for basic plasma generation and reliable start during the inherently transient ignition stage. The primary inductive element 130 can be coupled to a powerful RF generator and expensive auto-tuning matching network and can be operated at an increased RF frequency, such as at about 13.56 MHz.

The secondary inductive element 140 can be used for corrective and supportive functions and for improving the stability of the plasma during steady state operation. Since the secondary inductive element 140 can be used primarily for corrective and supportive functions and improving stability of the plasma during steady state operation, the secondary inductive element 140 does not have to be coupled to as powerful an RF generator as the primary inductive element 130 and can be designed differently and cost effectively to overcome the difficulties associated with previous designs. As discussed in detail below, the secondary inductive element 140 can also be operated at a lower frequency, such as at about 2 MHz, allowing the secondary inductive element 140 to be very compact and to fit in a limited space on top of the dielectric window.

The primary inductive element 130 and the secondary inductive element 140 can be operated at different frequencies. The frequencies can be sufficiently different to reduce cross-talk in the plasma between the primary inductive element 130 and the secondary inductive element 140. For instance, the frequency applied to the primary inductive element 130 can be at least about 1.5 times greater than the frequency applied to the secondary inductive element 140. In some implementations, the frequency applied to the primary inductive element 130 can be about 13.56 MHz and the frequency applied to the secondary inductive element 140 can be in the range of about 1.75 MHz to about 2.15 MHz. Other suitable frequencies can also be used, such as about 400 kHz, about 4 MHz, and about 27 MHz. While the present disclosure is discussed with reference to the primary inductive element 130 being operated at a higher frequency relative to the secondary inductive element 140, those of ordinary skill in the art, using the disclosures provided herein, should understand that the secondary inductive element 140 could be operated at the higher frequency without deviating from the scope of the present disclosure.

The secondary inductive element 140 can include a planar coil 142 and a magnetic flux concentrator 144. The magnetic flux concentrator 144 can be made from a ferrite material. Use of a magnetic flux concentrator with a proper coil can give high plasma coupling and good energy transfer efficiency of the secondary inductive element 140 and can significantly reduce its coupling to the metal shield 150. Use of a lower frequency, such as about 2 MHz, on the secondary inductive element 140 can increase skin layer, which also improves plasma heating efficiency.

According to aspects of the present disclosure, the different inductive elements 130, 140 can carry different functions. Specifically, the primary inductive element 130 can be used to carry out the basic functions of plasma generation during ignition and providing enough priming for the secondary inductive element 140. The primary inductive element 130 can have coupling to both plasma and the grounded shield to stabilize plasma potential. The first Faraday shield 154 associated with the primary inductive element 130 avoids window sputtering and can be used to supply the coupling to the ground.

Additional coils can be operated in the presence of good plasma priming provided by the primary inductive element 130 and as such, preferably have good plasma coupling and good energy transfer efficiency to plasma. A secondary inductive element 140 that includes a magnetic flux concentrator 144 provides both a good transfer of magnetic flux to plasma volume and at the same time a good decoupling of the secondary inductive element 140 from the surrounding metal shield 150. The use of magnetic flux concentrators 144 and symmetric driving of the secondary conductive element 140 further reduces the amplitude of the voltage between coil ends and surrounding grounded elements. This can reduce sputtering of the dome, but at the same time gives some small capacitive coupling to plasma, which can be used to assist ignition. In some implementations, a second Faraday shield can be used in combination with this secondary inductive element 140 to reduce capacitive coupling of the secondary inductive element 140.

The plasma processing apparatus 100 can include a pump assembly 200. The pump assembly 200 can include a pump 210 and a pumping port 220. The pump 210 can be fluidly coupled to the multi-head processing chamber 101 via the pumping port 220. In this manner, the pump 210 can be configured to evacuate gases from the multi-head processing chamber 101 via the pumping port 220. For instance, the pump can be operated to evacuate gases from the first processing area 102, the second processing area 103, or both.

In some implementations, the pump 210 can be a turbomolecular pump having a plurality of stages. Each of the plurality of stages can include a rotor blade and a stationary stator blade. The turbomolecular pump can intake gas (e.g. from multi-head processing chamber 101) at the uppermost stage and push the gas through successive stages of the turbomolecular pump.

In some implementations, the pump assembly 200 can include a pressure sensor (e.g., manometer) positioned at an inlet of the pumping port 220. In this manner, the pressure sensor 230 can be configured to measure a pressure of the combined flow of gas (e.g., gas evacuated from first processing area 102 and gas evacuated from second processing area 103). In some implementations, the throttle valve 125 can be controlled based, at least in part, on data obtained from the pressure sensor. However, since the pressure sensor is positioned at the inlet of the pumping port 220 that is downstream of both the first head and the second head, the data obtained from the pressure sensor 230 cannot be indicative of a pressure differential between a pressure of a flow of gas entering the first processing area 102 via the first showerhead 120 and a pressure of a flow of gas entering the second processing area 103 via the second showerhead 122 due, in part, to the throttle valve 125 being in an intermediate third position. As will be discussed below, examples aspects of the present disclosure are directed to pressure control systems for controlling the pressure differential to reduce or eliminate non-uniformities in processing of the workpiece (e.g., first workpiece 108 and second workpiece 109) due, at least in part, to the pressure differential.

Figure 2:
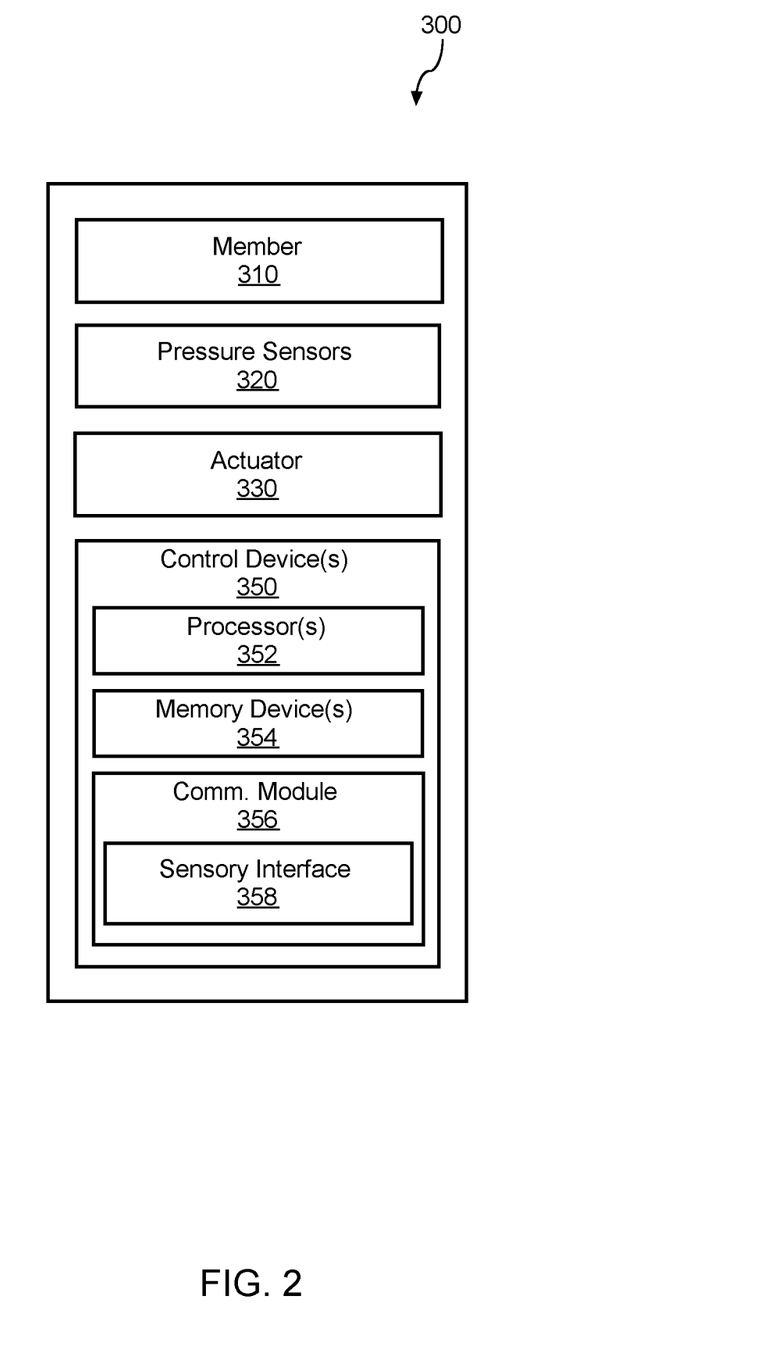
FIG. 2 depicts a block diagram of components of a pressure control system for a multi-head processing chamber of a plasma processing apparatus according to an example embodiment of the present disclosure.
Figure 3:
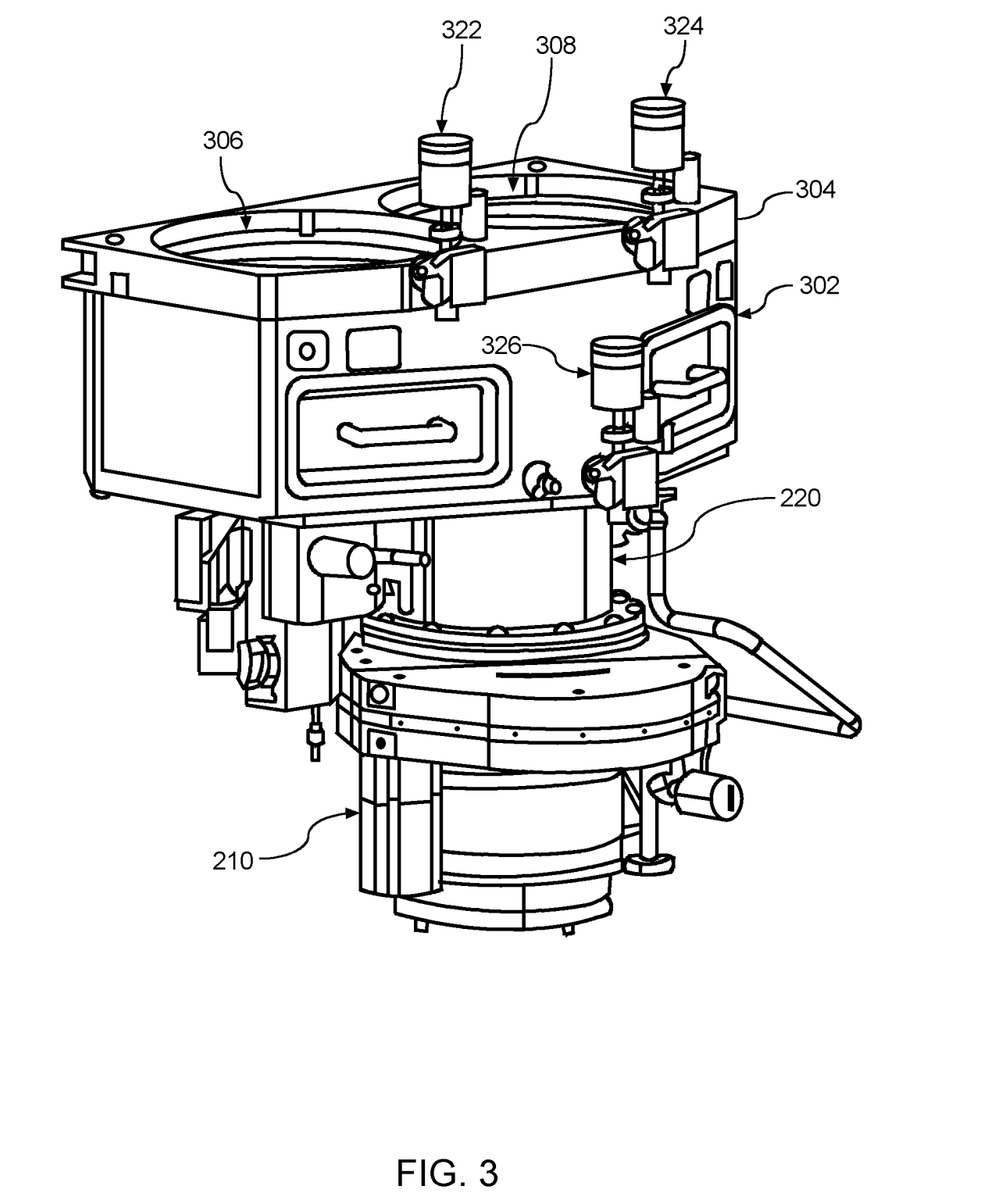
FIG. 3 depicts pressure sensors of a pressure control system mounted to a multi-head processing chamber according to example embodiments of the present disclosure.

Referring now to FIGS. 2 and 3, a pressure control system 300 for a multi-head processing chamber 302 is provided according to example embodiments of the present disclosure. In some implementations, the multi-head processing chamber 302 can include a top plate 304 defining a first head 306 and a second head 308. In alternative implementations, the top plate 304 can define more than two heads (e.g., first head 306 and second head 308). It should be understood that gas can be injected into the multi-head processing chamber 302 at the first head 306 and the second head 308. For instance, gas can be injected into the multi-head processing chamber 302 at the first head 306 via a first gas feed (e.g., first showerhead 120). Conversely, gas can be injected into the multi-head processing chamber 302 at the second head 308 via a second gas feed (e.g., second showerhead).

As shown, the pressure control system 300 can include a member 310 at least partially positioned within the pumping port 220. Furthermore, the member 310 can be movable relative to the pumping port 220. The pressure control system 300 can further include a plurality of pressure sensors 320. For instance, the pressure control system 300 can include a first pressure sensor 322 configured to obtain data indicative of a pressure of a flow of gas entering the first processing area 102 (FIG. 1) at the first head 306 of the multi-head processing chamber 302. The pressure control system 300 can further include a second pressure sensor 324 configured to obtain data indicative of a pressure of a flow of gas entering the second processing area 103 (FIG. 1) at the second head 308 of the multi-head processing chamber 302. It should be understood that the first pressure sensor 322 and the second pressure sensor 324 can include any suitable type of pressure sensor. For instance, in some implementations, the first pressure sensor 322 and the second pressure sensor 324 can each include a manometer.

In some implementations, the pressure control system 300 can include a third pressure sensor 326. For instance, the third pressure sensor 326 can be positioned at an inlet of the pumping port 220. In this manner, the third pressure sensor 326 can be configured to measure a pressure of a flow of gas being evacuated from the multi-head processing chamber 302.

As shown, the pressure control system 300 can include an actuator 330 configured to move the member 310. The actuator 330 can be configured to rotate the member 310 about an axis of rotation in a first direction (e.g., clockwise) or a second direction (e.g., counterclockwise). For instance, the actuator 330 can be configured to rotate the member 310 in the first direction or the second direction based, at least in part, on first data obtained from the first pressure sensor 322, second data obtained from the second pressure sensor 324, or both. As will be discussed below, the actuator 330 can rotate the member 310 in the first direction or the second direction to control a pressure differential between the pressure of the flow of gas entering a first processing area of the multi-head processing chamber 302 and the pressure of the flow of gas entering a second processing area of the multi-head processing chamber 302.

In some implementations, the actuator 330 can rotate the member 310 in the first direction or the second direction to eliminate or reduce the pressure differential. For instance, the actuator 330 can be configured to rotate the member 310 in the first direction or the second direction until the first data obtained from the first pressure sensor 322 and the second data obtained from the second pressure sensor 324 indicate the pressure of the flow of gas entering the multi-head processing chamber 302 at the first head 306 thereof matches the pressure of the flow of gas entering the multi-head processing chamber 302 at the second head 308 thereof. In this manner, the pressure control system 300 can monitor the pressure differential in real-time or near-real time and operate the actuator 330 to move the member 310 as needed to reduce or eliminate the pressure differential and thereby prevent or reduce the occurrence of non-uniformities in processing of workpieces being processed within the multi-head processing chamber 302.

In some implementations, the actuator 330 can rotate the member 310 in the first direction or the second direction to cause a pressure differential between the pressure of the flow of gas entering the multi-head processing chamber 302 at the first head 306 thereof and the pressure of the flow of gas entering the multi-head processing chamber 302 at the second head 308 thereof. For instance, in some implementations, the actuator 330 can be configured to rotate the member 310 in the first direction or the second direction until the first data obtained from the first pressure sensor 322 and the second data obtained from the second pressure sensor 324 indicate that the pressure differential matches a predefined pressure differential.

In some implementations, the pressure control system 300 can include one or more control devices 350. As shown, the one or more control devices 350 can include one or more processors 352 configured to perform a variety of computer-implemented functions (e.g., performing the methods, steps, calculations and the like disclosed herein). As used herein, the term "processor" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits.

In some implementations, the one or more control devices 350 can include one or more memory devices 354. Examples of the one or more memory device 354 can include computer-readable media including, but not limited to, non-transitory computer-readable media, such as RAM, ROM, hard drives, flash drives, or other suitable memory devices. The one or more memory devices 354 can store information accessible by the one or more processors 352, including computer-readable instructions that can be executed by the one or more processors 352. The computer-readable instructions can be any set of instructions that, when executed by the one or more processors 352, cause the one or more processors 352 to perform operations, such as controlling operation of the actuator 330 based, at least in part, on data obtained from one or more of the pressure sensors 320. The computer-readable instructions can be software written in any suitable programming language or can be implemented in hardware.

In some implementations, the one or more control devices 350 can include a communications module 356 to facilitate communication between the one or more control devices 350 and various components of the pressure control system 300. For instance, the one or more control devices 350 can send control signals to control operation of the actuator 330 of the pressure control system 300. Furthermore, the control signals can be based, at least in part, on the first data obtained from the first pressure sensor 322, the second data obtained from the second pressure sensor 324, or both.

In some implementations, the communications module 356 can include a sensor interface 358 to permit signals transmitted from the pressure sensors 320 to be converted into signals that can be understood and processed by the one or more control devices 350. For example, the pressure sensors 320 can be communicatively coupled to the sensor interface 358 via a wired or wireless communications link. In this manner, the one or more control devices 350 can receive data associated with the pressure sensors 320.

Figure 4:
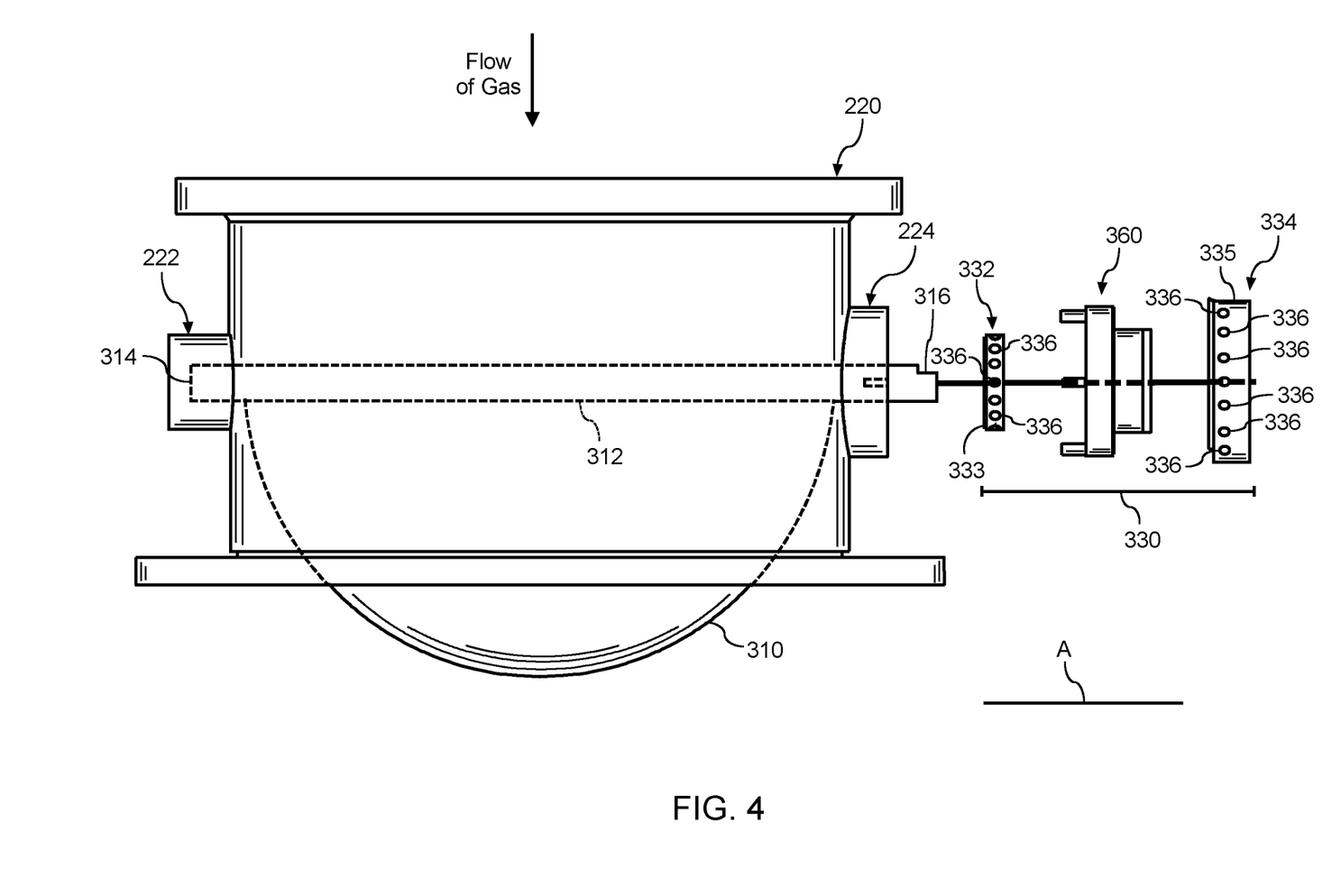
FIG. 4 depicts a pressure control system for a multi-head processing chamber of a plasma processing apparatus according to example embodiments of the present disclosure.

Referring now to FIG. 4, the member 310 can, in some implementations, include a shaft 312 extending along an axis of rotation A between a first end 314 of the shaft 312 and a second end 316 of the shaft 312. As shown, the first end 314 of the shaft 312 can be positioned within a first projection 222 of the pumping port 220, whereas the second end 316 of the shaft 312 can extend through a second projection 224 of the pumping port 220. As shown, the first projection 222 and the second projection 224 can be circumferentially spaced apart from one another. In some implementations, the first projection 222 can be capped to prevent the first end 314 of the shaft 312 from extending therethrough. Conversely, in some implementations, the second projection 224 can be open (that is, not capped) to allow the second end 316 of the shaft 312 to extend therethrough. In alternative implementations, the actuator 330 can include a cap 360 configured to seal off the open end of the second projection 224 on the pumping port 220. In this manner, the interior of the pumping port 220 can be sealed off from an external environment via the cap 360.

In some implementations, the actuator 330 can include a magnet assembly. For instance, the actuator 330 can include a first magnetic coupler 332 and a second magnetic coupler 334. The first magnetic coupler 332 and the second magnetic coupler 334 can each have an annular body 333, 335. Furthermore, the first magnetic coupler 332 and the second magnetic coupler 334 can each include a plurality of magnets 336. As shown, each of the plurality of magnets 336 can be positioned within a corresponding recess of a plurality of recesses defined by the annular body 333, 335. In some implementations, the annular body 333, 335 can be a magnetic shield.

The first magnetic coupler 332 can be sized such that the first magnetic coupler 332 can be positioned within the second projection 224 of the pumping port 220. Conversely, the second magnetic coupler 334 can be sized such that the second magnetic coupler 334 slides over an exterior surface of the second projection 224. It should be understood that each of the plurality of magnets 336 associated with the second magnetic coupler 334 can be magnetically coupled with a corresponding magnet 336 of the plurality of magnets 336 associated with the first magnetic coupler 332. In this manner, the magnets 336 can drive rotation of the member 310 about the axis of rotation A in the first direction (e.g., clockwise) or the second direction (e.g., counterclockwise).

Figure 5A:
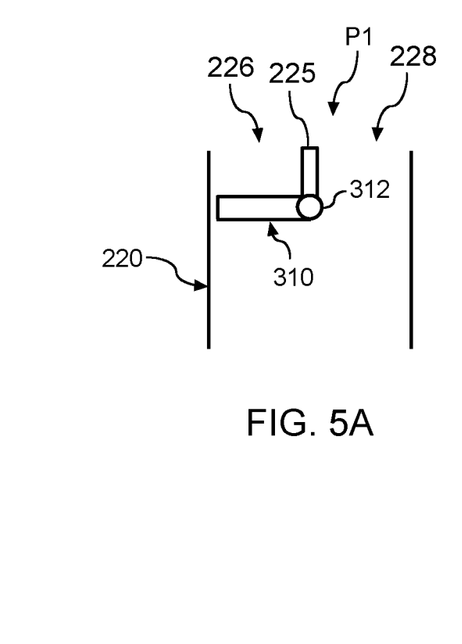
FIG. 5A depicts a member of the pressure control system of FIG. 4 in a first position according to example embodiments of the present disclosure.
Figure 5B:
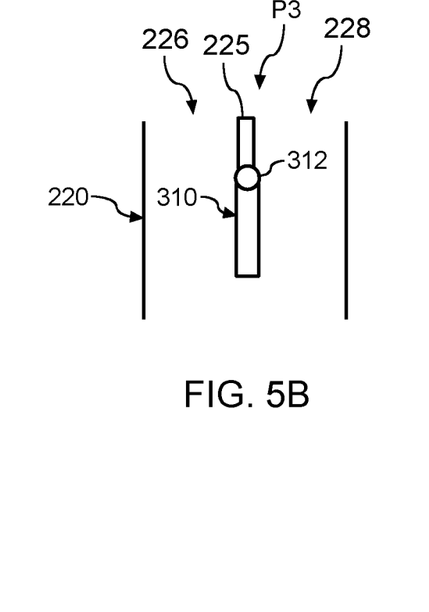
FIG. 5B depicts the member of the pressure control system of FIG. 4 in an intermediate third position according to example embodiments of the present disclosure.
Figure 5C:
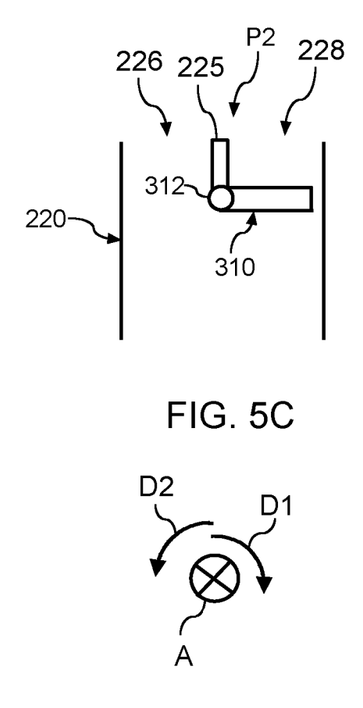
FIG. 5C depicts the member of the pressure control system of FIG. 4 in a second position according to example embodiments of the present disclosure.

Referring now to FIGS. 5A, 5B and 5C, the member 310 can rotate relative to a partition wall 225 of the pumping port 220 that divides an inlet of the pumping port 220 into a first inlet 226 and a second inlet 228. When the member 310 is rotated about the axis of rotation A in a first direction D1 (e.g., clockwise) to a first position P1, the member 310 can obstruct the first inlet 226. In this manner, gas cannot flow through the pumping port 220 via the first inlet 226 thereof. Conversely, the member 310 can obstruct the second inlet 228 when the member 310 is rotated about the axis of rotation A in a second direction D2 (e.g., counterclockwise) to a second position P2. Furthermore, the member 310 can be rotated about the axis of rotation A in the first direction D1 or the second direction D2 to a third intermediate position P3 in which the member 310 obstructs neither the first inlet 226 nor the second inlet 228.

Figure 6:
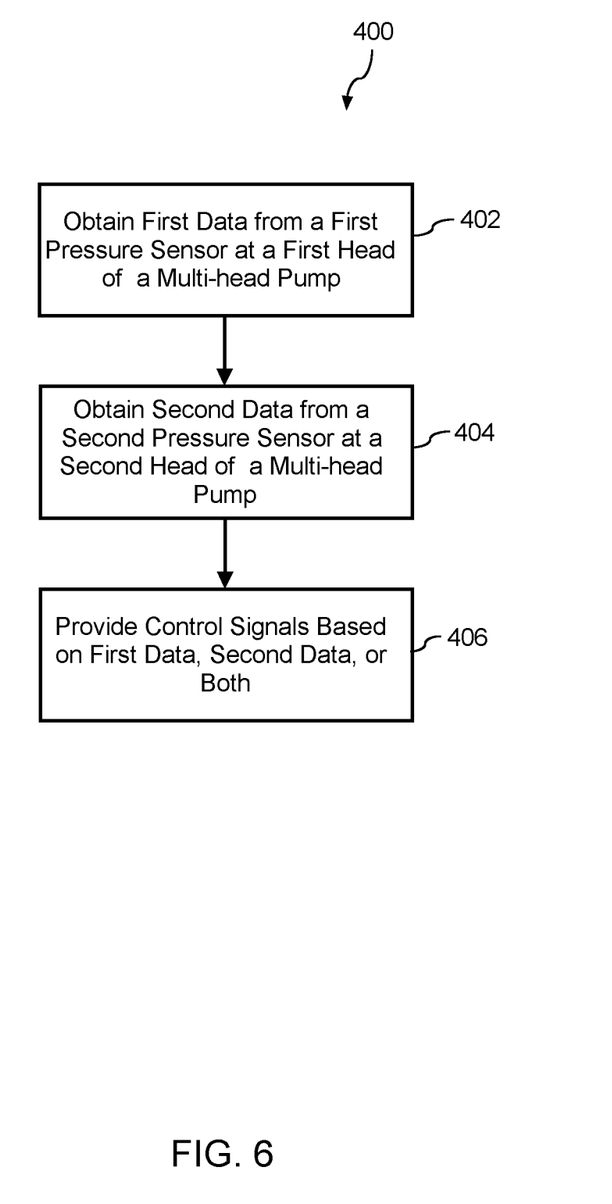
FIG. 6 depicts a flow diagram of operating a pressure control system for a multi-head processing chamber of a plasma processing apparatus according to example embodiments of the present disclosure.

Referring now to FIG. 6, a flow diagram of a method 400 for controlling operation of a pressure control system for a multi-head processing chamber of a plasma processing apparatus is provided according to example embodiments of the present disclosure. It should be appreciated that the method 400 can be implemented using the pressure control system 300 discussed above with reference to FIGS. 2 and 3. FIG. 6 depicts steps performed in a particular order for purposes of illustration and discussion. Those of ordinary skill in the art, using the disclosures provided herein, will understand that various steps of the method 400 may be adapted, modified, rearranged, performed simultaneously or modified in various ways without deviating from the scope of the present disclosure.

At (402), the method 400 can include obtaining, by one or more control devices, first data from a first pressure sensor of the pressure control system. For instance, the first data can be indicative of a pressure of a first flow of gas at a first head of the multi-head processing chamber. In some implementations, the first pressure sensor can be a manometer.

At (404), the method 400 can include obtaining, by the one or more control devices, second data from a second pressure sensor. For instance, the second data can be indicative of a second flow of gas at a second head of the multi-head processing chamber. In some implementations, the second pressure sensor can be a manometer.

At (406), the method 400 can include providing, by the one or more control devices, one or more control signals based on the first data obtained at (402), the second data obtained at (404), or both. For instance, the one or more control signals can be associated with rotating a member (e.g., a flap) at least partially positioned within a pumping port fluidly coupled between the multi-head processing chamber and a pump configured to evacuate gases from the multi-head processing chamber.

In some implementations, only one of the processing areas of the multi-head processing chamber may be occupied. For instance, a workpiece can be disposed on the pedestal assembly associated with the first processing area of the multi-head processing chamber, whereas every other processing area of the multi-head processing chamber can be vacant (that is, not occupied by a workpiece). Furthermore, since only the first processing area of the multi-head processing chamber is occupied, gas can be injected into the first processing area at the first head of the multi-head processing chamber. In such implementations, providing the one or more control signals can include providing the one or more control signals to an actuator configured to rotate the member in the first direction or the second direction based, at least in part, on the one or more control signals to adjust a pressure of the flow of gas entering the multi-head processing chamber at the first head of the multi-head processing chamber.

In some implementations, multiple processing areas of the multi-head processing chamber may be occupied. For instance, a first workpiece can be disposed on the pedestal assembly associated with the first processing area, whereas a second workpiece can be disposed on the pedestal assembly associated with the second processing area. In such implementations, gas can be injected into the first processing area at the first head of the multi-head processing chamber. Additionally, gas can be injected into the second processing area at the second head of the multi-head processing chamber. As will be discussed below, providing the one or more control signals at (406) can include providing the one or more control signals to an actuator configured to rotate the member about the axis of rotation in the first direction or the second direction based, at least in part, on the one or more control signals to control a pressure differential between the pressure of the flow of gas entering the first processing area at the first head of the multi-head processing chamber and the pressure of the flow of gas entering the second processing area at the second head of the multi-head processing chamber.

In some implementations, the actuator can rotate the member about the axis of rotation in the first direction or the second direction to eliminate or reduce the pressure differential. For instance, the actuator can be configured to rotate the member in the first direction or the second direction until the first data obtained from the first pressure sensor and the second data obtained from the second pressure sensor indicate the pressure of the flow of gas entering the first processing area matches the pressure of the flow of gas entering the second processing area. In this manner, the pressure control system can monitor the pressure differential in real-time or near-real time and operate the actuator accordingly to eliminate the pressure differential to prevent or reduce occurrence of non-uniformities in processing of the workpieces (e.g., first workpiece and second workpiece) being processed within the multi-head processing chamber.

In some implementations, the actuator can rotate the member about the axis of rotation in the first direction or the second direction to cause a desired pressure differential between the pressure of the flow of gas entering the first processing area and the pressure of the flow of gas entering the second processing area. For instance, in some implementations, the actuator can be configured to rotate the member in the first direction or the second direction until the first data obtained from the first pressure sensor and the second data obtained from the second pressure sensor indicate that the pressure differential matches a predefined pressure differential that is greater than zero.

Figure 7:
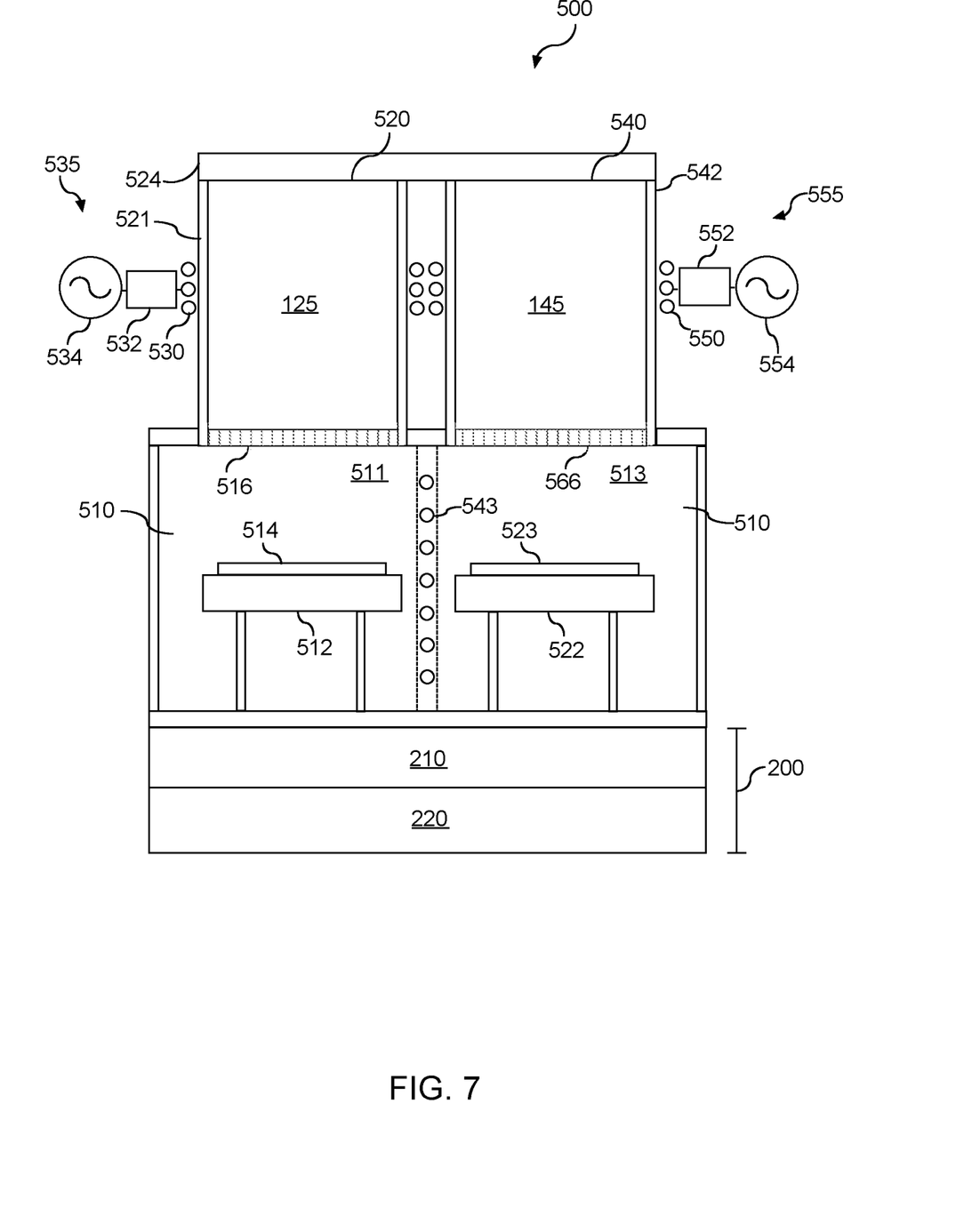
FIG. 7 depicts another plasma processing apparatus according to an example embodiment of the present disclosure.

FIG. 7 depicts a plasma processing apparatus 500 according to another example embodiment of the present disclosure. The plasma processing apparatus 500 includes a processing chamber 510 and a first plasma chamber 520 (e.g., first plasma head) that is separate from the processing chamber 510. The plasma processing apparatus 500 can include a second plasma chamber 540 (e.g., second plasma head) that can be substantially identical to the first plasma chamber 520. A top plate 524 can be disposed above the first plasma chamber 520 and the second plasma chamber 540.

The first plasma chamber 520 can include a dielectric sidewall 521. The top plate 524 and dielectric sidewall 521 can form a first plasma chamber interior 525. Dielectric sidewall 521 can be formed from any suitable dielectric material, such as quartz.

The plasma processing apparatus 500 can include a first inductively coupled plasma source 535 configured to generate a plasma in a process gas provided to the first plasma chamber interior 525. The first inductively coupled plasma source 535 can include induction coil 530 disposed about the dielectric sidewall 521. The induction coil 530 can be coupled to an RF power generator 534 through a suitable matching network 532. Reactant and/or carrier gases can be provided to the chamber interior from a gas supply (not illustrated). When the induction coil 530 is energized with RF power from the RF power generator 534, a substantially inductive plasma is induced in the first plasma chamber interior 525. In some embodiments, the first plasma chamber 520 can include a grounded Faraday shield to reduce capacitive coupling of the induction coil 530 to the plasma.

The second plasma chamber 540 can include a dielectric sidewall 542. The top plate 524 and dielectric sidewall 542 can form a second plasma chamber interior 545. Dielectric sidewall 542 can be formed from any suitable dielectric material, such as quartz.

The plasma processing apparatus 500 can include a second inductively coupled plasma source 555 configured to generate a plasma in a process gas provided to the second plasma chamber interior 545. The second inductively coupled plasma source 555 can include induction coil 550 disposed about the dielectric sidewall 542. The induction coil 550 can be coupled to an RF power generator 554 through a suitable matching network 552. Reactant and/or carrier gases can be provided to the second plasma chamber interior 545 from a gas supply (not illustrated). When the induction coil 550 is energized with RF power from the RF power generator 554, a substantially inductive plasma is induced in the second plasma chamber interior 545. In some embodiments, the second plasma chamber 540 can include a grounded Faraday shield to reduce capacitive coupling of the induction coil 550 to the plasma.

A first separation grid 516 can separate the first plasma chamber 520 from the processing chamber 510. The first separation grid 516 can be used to perform ion filtering of particles generated by plasma in the first plasma chamber 520. Particles passing through the first separation grid 516 can be exposed to a workpiece (e.g., a semiconductor wafer) in the processing chamber for surface treatment of a workpiece (e.g., photoresist removal).

More particularly, in some embodiments, the first separation grid 516 can be transparent to neutral species but not transparent to charged particles from the plasma. For example, charged particles or ions can recombine on walls of the first separation grid 516. The first separation grid 516 can include one or more grid plates of material with holes distributed according to a hole pattern for each sheet of material. The hole patterns can be the same or different for each grid plate.

For example, the holes can be distributed according to a plurality of hole patterns on a plurality of grid plates arranged in a substantially parallel configuration such that no hole allows for a direct line of sight between the plasma chamber and the processing chamber to, for example, reduce or block UV light. Depending on the process, some or all of the grid can be made of a conductive material (e.g., Al, Si, SiC, etc.) and/or non-conductive material (e.g., quartz, etc.). In some embodiments, if a portion of the grid (e.g. a grid plate) is made of a conductive material, the portion of the grid can be grounded.

A second separation grid 566 can separate the second plasma chamber 540 from the processing chamber 510. The second separation grid 566 can be used to perform ion filtering of particles generated by plasma in the second plasma chamber 540. Particles passing through the second separation grid 566 can be exposed to a workpiece (e.g., a semiconductor wafer) in the processing chamber for surface treatment of the workpiece (e.g., photoresist removal).

More particularly, in some embodiments, the second separation grid 566 can be transparent to neutral species but not transparent to charged particles from the plasma. For example, charged particles or ions can recombine on walls of the second separation grid 566. The second separation grid 566 can include one or more grid plates of material with holes distributed according to a hole pattern for each sheet of material. The hole patterns can be the same or different for each grid plate.

For example, the holes can be distributed according to a plurality of hole patterns on a plurality of grid plates arranged in a substantially parallel configuration such that no hole allows for a direct line of sight between the plasma chamber and the processing chamber to, for example, reduce or block UV light. Depending on the process, some or all of the grid can be made of a conductive material (e.g., Al, Si, SiC, etc.) and/or non-conductive material (e.g., quartz, etc.). In some embodiments, if a portion of the grid (e.g. a grid plate) is made of a conductive material, the portion of the grid can be grounded.

To improve azimuth uniformity, the plasma processing apparatus 500 can include a first pedestal 512 (e.g., a heated pedestal) defining a first processing station for supporting a first workpiece 514 beneath the first plasma chamber 520 for processing the first workpiece 514. The plasma processing apparatus 500 can further include a second pedestal 522 (e.g., heated pedestal) defining a second processing station for supporting a second workpiece 523 beneath the second plasma chamber 540 for processing the second workpiece 254 at the second processing station. The first pedestal 512 is separated from the second pedestal 522 such that there is no solid mass connecting the first pedestal 512 and the second pedestal 522.

In some embodiments, an optional wall 541 can partition the processing chamber 510 into a first processing area 511 and a second processing area 513. In this manner, the wall 541 can separate the first pedestal 512 and the second pedestal 522 such that the first pedestal 512 is disposed within the first processing area 511 and the second pedestal 522 is disposed within the second processing area 513. The wall 541 can include a wall temperature regulation system 543. The wall temperature regulation system 543 can include one or more heating elements. Alternatively, or additionally, the wall temperature regulation system 543 can include one or more cooling channels operable to circulate fluid through the wall.

As shown, the plasma processing apparatus 500 can include the pumping assembly discussed above with reference to FIG. 1. For instance, the pump 210 can be fluidly coupled to the processing chamber 510 via the pumping port 220. In this manner, the pump 210 can be configured to evacuate gases from the processing chamber 510.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged in whole or in part. Furthermore, those of ordinary skill in the art will appreciate that the foregoing description is by way of example only and is not intended to limit the invention so further described in such appended claims.

What is claimed is:

1. A pressure control system comprising:
a member at least partially positioned within a pumping port fluidly coupled between a multi-head processing chamber and a pump configured to evacuate gases from the multi-head processing chamber, the member rotatable relative to the pumping port, the member includes a shaft having a first end extending into a first projection of the pumping port and a second end extending through a second projection of the pumping port;
a plurality of pressure sensors, each of the pressure sensors configured to obtain data indicative of a pressure of a flow of gas entering the multi-head processing chamber at a corresponding head of the multi-head processing chamber; and
an actuator configured to rotate the member to control a pressure of a flow of gas at a first head of the multi-head processing chamber, the actuator positioned proximate to the second end of the shaft, the actuator comprising a first magnetic coupler, a cap, and a second magnetic coupler.

2. The pressure control system of claim 1, wherein the actuator is configured to rotate the member in a first direction or a second direction to control the pressure of the flow of gas at the first processing head of the multi-head processing chamber.

3. The pressure control system of claim 1, wherein each of the pressure sensors comprises a manometer.

4. The pressure control system of claim 1, wherein the actuator is configured to rotate the member to control a pressure differential between the pressure of the flow of gas at the first head of the multi-head processing chamber and a pressure of a flow of gas at a second head of the multi-head processing chamber.

5. The pressure control system of claim 4, wherein the actuator is configured to rotate the member in a first direction or a second direction to reduce the pressure differential from a first value to a second value, the second value being greater than zero.

6. The pressure control system of claim 4, wherein the actuator is configured to rotate the member in a first direction or a second direction to increase the pressure differential from a first value to a second value.

7. The pressure control system of claim 1, wherein the first magnetic coupler positioned within the second projection, the second magnetic coupler surrounding an exterior surface of the second projection.

8. The pressure control system of claim 7, wherein the first magnetic coupler and the second magnetic coupler each comprise a magnetic shield and a plurality of magnets, each of the magnets positioned within a corresponding recess of a plurality of recesses defined by the magnetic shield.

9. A plasma processing apparatus comprising:
a multi-head processing chamber;
a pumping port fluidly coupled to the multi-head processing chamber;

a pump fluidly coupled to the multi-head processing chamber via the pumping port, the pump configured to evacuate gas from the multi-head processing chamber via the pumping port; and a pressure control system comprising:
- a member at least partially positioned within the pumping port, the member rotatable relative to the pumping port, the member includes a shaft having a first extending into a first projection of the pumping port and a second end extending through a second projection of the pumping port;
- a plurality of pressure sensors, each of the pressure sensors configured to obtain data indicative of a pressure of a flow of gas entering the multi-head processing chamber via a corresponding head of the multi-head processing chamber; and
- an actuator configured to rotate the member to control a pressure of a flow of gas at a first head of the multi-head processing chamber, the actuator positioned proximate to the second end of the shaft, the actuator comprising a first magnetic coupler, a cap, and a second magnetic coupler.

10. The plasma processing apparatus of claim 9, wherein the actuator is configured to rotate the member to control a pressure differential between the pressure of the flow of gas at the first head and a pressure of a flow of gas at a second head of the multi-head processing chamber.

11. The plasma processing apparatus of claim 9, wherein the pump comprises a turbomolecular pump.

12. The plasma processing apparatus of claim 9, wherein the member comprises a flap.

13. The plasma processing apparatus of claim 12, wherein the flap has a range of motion of about 180 degrees.

* * * * *